(12) United States Patent
Elsahwi (10) Patent No.: US 12,298,334 B2
(45) Date of Patent: *May 13, 2025

(54) SYSTEM AND METHOD FOR DETERMINING THE IMPEDANCE PROPERTIES OF A LOAD USING LOAD ANALYSIS SIGNALS

(71) Applicant: Essam Samir Elsahwi, Toronto (CA)

(72) Inventor: Essam Samir Elsahwi, Toronto (CA)

( * ) Notice: Subject to any disclaimer, the term of this patent is extended or adjusted under 35 U.S.C. 154(b) by 0 days.

This patent is subject to a terminal disclaimer.

(21) Appl. No.: 18/509,838

(22) Filed: Nov. 15, 2023

(65) Prior Publication Data
US 2024/0159807 A1 May 16, 2024

Related U.S. Application Data

(63) Continuation of application No. 17/560,834, filed on Dec. 23, 2021, now Pat. No. 11,860,205, which is a continuation of application No. 16/925,601, filed on Jul. 10, 2020, now Pat. No. 11,249,124.

(60) Provisional application No. 62/872,739, filed on Jul. 11, 2019.

(51) Int. Cl.
| | |
|---|---|
| *G01R 27/26* | (2006.01) |
| *G01N 27/02* | (2006.01) |
| *G01R 27/14* | (2006.01) |
| *G01R 31/389* | (2019.01) |

(52) U.S. Cl.
CPC ........... *G01R 27/26* (2013.01); *G01N 27/026* (2013.01); *G01R 27/14* (2013.01); *G01R 31/389* (2019.01)

(58) Field of Classification Search
CPC ........ G01R 27/00; G01R 27/02; G01R 27/12; G01R 27/14; G01R 27/16; G01R 27/18; G01R 27/26; G01R 27/2605; G01R 27/2611; G01R 31/00; G01R 31/36; G01R 31/389; G01N 27/00; G01N 27/02;
(Continued)

(56) References Cited

U.S. PATENT DOCUMENTS

| | | |
|---|---|---|
| 4,024,371 A | 5/1977 | Drake |
| 5,006,786 A | 4/1991 | Mckubre et al. |
| 5,872,443 A | 2/1999 | Williamson |

(Continued)

FOREIGN PATENT DOCUMENTS

WO 2018220223 A1 12/2018

OTHER PUBLICATIONS

PCT/CA2020/050956, "International Search Report and Written Opinion", dated Sep. 30, 2020, 7 pages.

(Continued)

*Primary Examiner* — Hoai-An D. Nguyen
(74) *Attorney, Agent, or Firm* — SMART & BIGGAR LP (57) ABSTRACT

Various embodiments are described herein for measuring the impedance properties of a load using load analysis signals. In one example embodiment, a transformer is provided which includes at least one primary winding, and at least one secondary winding. The at least one primary winding is coupled in series between a direct-current (DC) power supply and the load. A variable alternating-current (AC) voltage generator is coupled in-series to the at least one secondary winding, and is configured generate at least one load analysis signal for injection into the load. The impedance properties of the load may be determined for different frequencies in the load analysis signals.

20 Claims, 6 Drawing Sheets

(58) Field of Classification Search
CPC .... G01N 27/026; G01N 27/028; G01N 27/04; G01N 27/045
USPC ..... 324/600, 649, 691, 713, 76.11, 126, 127
See application file for complete search history.

(56) References Cited

U.S. PATENT DOCUMENTS

| | | |
|---|---|---|
| 6,339,334 B1 | 1/2002 | Park et al. |
| 7,432,699 B2 | 10/2008 | AF Klercker Alakula |
| 9,183,980 B2 | 11/2015 | Hamberger et al. |
| 10,032,556 B2 | 7/2018 | Bachinger et al. |
| 11,249,124 B2 | 2/2022 | Elsahwi |
| 11,474,154 B1 | 10/2022 | Castelaz |
| 11,860,205 B2 | 1/2024 | Elsahwi |
| 12,041,434 B2 * | 7/2024 | Lesso .................. H03F 3/68 |
| 2005/0088225 A1 | 4/2005 | Louis et al. |
| 2009/0071652 A1 | 3/2009 | Vinegar |
| 2014/0077828 A1 | 3/2014 | Gruden et al. |
| 2016/0258820 A1 | 9/2016 | Pollock et al. |
| 2018/0203073 A1 | 7/2018 | Christensen et al. |
| 2020/0186927 A1 | 6/2020 | Lesso et al. |

OTHER PUBLICATIONS

EP20836659.1, "Extended European Search Report," dated Jul. 14, 2023, 9 pages.

* cited by examiner

SYSTEM AND METHOD FOR DETERMINING THE IMPEDANCE PROPERTIES OF A LOAD USING LOAD ANALYSIS SIGNALS

CROSS-REFERENCE TO RELATED APPLICATIONS

This application is a Continuation of U.S. Ser. No. 17/560,834 filed on Dec. 23, 2021, which is a continuation of U.S. application Ser. No. 16/925,601 filed on Jul. 10, 2020 (now Issued U.S. Pat. No. 11,249,124), which claims the benefit of U.S. Provisional Application No. 62/872,739 filed on Jul. 11, 2019, the complete disclosures of which are incorporated herein by reference.

FIELD

The described embodiments relate to determining the impedance properties of a load, and in particular, to a system and method for determining the impedance properties of a load using load analysis signals.

BACKGROUND

In recent years, impedance spectroscopy has found increasing wide-spread application as a non-invasive, and non-intrusive technique for monitoring state and health properties of electrical, electrochemical, and biological loads.

In impedance spectroscopy, a load is injected (e.g., interrogated or perturbed or excited) with one or more alternating-current (AC) signals characterized by different frequencies, or having different frequency components. A load impedance spectrum may then be generated by plotting the impedance response of the load as a function of the applied frequencies. In various cases, the impedance spectrum is then analyzed to determine electrical, physical, chemical, and biological properties of the interrogated load.

SUMMARY

In at least one broad aspect, there is provided a system for measuring impedance properties of a load, the system comprising: a transformer having at least one primary winding and at least one secondary winding; the at least one primary winding of the transformer being coupled in series between a direct-current (DC) power supply and the load, wherein the DC power supply is configured to generate a DC current across the at least one primary winding to power the load; at least one first sensor coupled to the load, wherein the at least one first sensor is configured to measure at least one attribute of the load; a variable alternating-current (AC) voltage generator coupled in-series to the at least one secondary winding, wherein the variable AC generator is configured generate at least one load analysis signal; and a controller operably coupled to the at least one first sensor, wherein the controller is configured to receive a first input signal from the at least one first sensor and is further configured to determine the impedance properties of the load based on the first input signal.

In some cases, the system may further comprise a variable DC voltage generator coupled in-series to the at least one secondary winding, wherein the variable DC voltage generator is configured to generate a DC de-biasing current across the at least one secondary winding, the DC de-biasing current being configured to reverse a DC flux bias generated in the transformer by the DC current flowing across the primary winding.

In some cases, the at least one secondary winding comprises a first secondary winding and a second secondary winding, and wherein: the variable DC voltage generator is coupled in-series to the first secondary winding, and the variable alternating-current (AC) voltage generator is coupled in-series to the second secondary winding.

In some cases, the at least one first sensor comprises a first voltage sensor coupled in parallel arrangement to the load.

In some cases, the system may further comprise at least one second sensor, wherein the at least one second sensor is configured to measure a parameter related to the DC current flowing across the primary winding of the transformer.

In some cases, the at least one second sensor comprises at least one of a current sensor, a second voltage sensor, and a hall-effect sensor.

In some cases, the at least one second sensor comprises the current sensor and the current sensor is coupled in-series to the load, wherein the current sensor is configured to measure the DC current flowing across the at least one primary winding of the transformer.

In some cases, the at least one second sensor comprises the second voltage sensor, and the second voltage sensor is coupled in parallel arrangement to the at least one primary winding of the transformer, wherein the second voltage sensor is configured to measure a DC voltage across the at least one primary winding of the transformer.

In some cases, the at least one second sensor comprises the hall-effect sensor, and the hall-effect sensor is located proximate the transformer, wherein the hall-effect sensor is configured to measure the DC flux bias in the transformer.

In some cases, the controller is operably coupled to the variable DC voltage generator, and the controller is further configured to: determine, based on a second input signal received from the at least one second sensor, the DC current flowing across the at least one primary winding of the transformer, and based on the determination, adjust the variable DC voltage generator to generate the DC de-biasing current.

In some cases, the variable AC voltage generator is configured to generate load analysis signals having frequencies in a very high frequency (VHF) range.

In some cases, the variable AC voltage generator is configured to generate load analysis signals having frequencies between 0 KHz and 1 GHz.

In some cases, the variable AC voltage generator is configured to generate a plurality of load analysis signals, each having at least one of a different frequency, phase and amplitude.

In some cases, the variable AC voltage generator is configured to generate a mixed-frequency load analysis signal.

In some cases, the controller is operably coupled to the variable AC voltage generator and is configured to control the frequency of the at least one load analysis signal generated by the variable AC voltage generator.

In some cases, the controller is configured to determine the impedance properties of the load based on a frequency of the at least one load analysis signal, and the first input signal from the at least one first sensor.

In some cases, the load comprises at least one a fuel cell, a battery, an electrolyser, a membrane for use in wastewater treatment, and at least one of an electroflotation, electroxidation and electrocoagulation water treatment cell.

In another broad aspect there is provided a method for measuring impedance properties of a load, the method comprising: powering a load with a direct-current (DC) power supply, wherein the load and the DC power supply are coupled to at least one primary winding of a transformer; and applying, using a variable alternating-current (AC) voltage generator, at least one load analysis signal to the load, wherein the variable AC voltage generator is coupled to the at least one secondary winding of the transformer.

The method may further comprise applying, using a variable DC voltage generator, a DC de-biasing current across at least one secondary winding of the transformer, wherein the variable DC voltage source is coupled to the at least one secondary winding of the transformer, wherein the DC de-biasing current is configured to reverse a DC flux bias generated in the transformer by the DC power supply.

The method may further comprise determining the impedance response of the load to the at least one load analysis signal.

In some cases, the at least one secondary winding comprises a first secondary winding and a second secondary winding, and wherein: the variable DC voltage generator is coupled in-series to the first secondary winding, and the variable alternating-current (AC) voltage generator is coupled in-series to the second secondary winding.

In some cases, the at least one first sensor comprises a first voltage sensor coupled in parallel arrangement to the load.

The method may further comprise measuring, using at least one second sensor, a parameter related to the DC current flowing across the primary winding of the transformer.

In some cases, the at least one second sensor comprises at least one of a current sensor, a second voltage sensor, and a hall-effect sensor.

In some cases, the at least one second sensor comprises the current sensor and the current sensor is coupled in-series to the load, and the method may further comprise measuring, using the current sensor, the DC current flowing across the at least one primary winding of the transformer.

In some cases, the at least one second sensor comprises the second voltage sensor, and the second voltage sensor is coupled in parallel arrangement to the at least one primary winding of the transformer, and the method may further comprise measuring, using the second voltage sensor, a DC voltage across the at least one primary winding of the transformer.

In some cases, at least one second sensor comprises the hall-effect sensor, and the hall-effect sensor is located proximate the transformer, and the method may further comprise measuring, using the hall-effect sensor, the DC flux bias in the transformer.

In some cases, the controller is operably coupled to the variable DC voltage generator, and the method may further comprise: determining, using the controller, based on a second input signal received from the at least one second sensor, the DC current flowing across the at least one primary winding of the transformer, and based on the determination, adjusting, using the controller, the variable DC voltage generator to generate the DC de-biasing current.

The method further comprise generating, using the variable AC voltage generator, load analysis signals having frequencies in a very high frequency (VHF) range.

The method may further comprise generating, using the variable AC voltage generator, load analysis signals having frequencies between 0 KHz and 1 GHz.

The method may further comprise generating, using the variable AC voltage generator, a plurality of load analysis signals, each having at least one of a different frequency, phase and amplitude.

The method may further comprise generating, using the variable AC voltage generator, a mixed-frequency load analysis signal.

In some cases, the controller is operably coupled to the variable AC voltage generator and the method may further comprise controlling, using the controller, the frequency of the at least one load analysis signal generated by the variable AC voltage generator.

The method may further comprise determining, using the controller, the impedance properties of the load based on a frequency of the at least one load analysis signal, and the first input signal from the at least one first sensor.

In some cases, the load comprises at least one a fuel cell, a battery, an electrolyser, a membrane for use in wastewater treatment, and at least one of an electroflotation, electroxidation and electrocoagulation water treatment cell.

Other features and advantages of the present application will become apparent from the following detailed description taken together with the accompanying drawings. It should be understood, however, that the detailed description and the specific examples, while indicating preferred embodiments of the application, are given by way of illustration only, since various changes and modifications within the spirit and scope of the application will become apparent to those skilled in the art from this detailed description.

BRIEF DESCRIPTION OF THE DRAWINGS

For a better understanding of the various embodiments described herein, and to show more clearly how these various embodiments may be carried into effect, reference will be made, by way of example, to the accompanying drawings which show at least one example embodiment and the figures will now be briefly described.

The skilled person in the art will understand that the drawings, described below, are for illustration purposes only. The drawings are not intended to limit the scope of the applicants' teachings in anyway. Also, it will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DESCRIPTION OF EXAMPLE EMBODIMENTS

Various apparatuses or processes will be described below to provide an example of various embodiments of the claimed subject matter. No embodiment described below limits any claimed subject matter and any claimed subject matter may cover processes, apparatuses, devices, or systems that differ from those described below. The claimed subject matter is not limited to apparatuses, devices, systems, or processes having all of the features of any one apparatus, device, system, or process described below or to features common to multiple or all of the apparatuses, devices, systems, or processes described below. It is possible that an apparatus, device, system, or process described below is not an embodiment of any claimed subject matter. Any subject matter that is disclosed in an apparatus, device, system, or process described below that is not claimed in this document may be the subject matter of another protective instrument, for example, a continuing patent application, and the applicants, inventors, or owners do not intend to abandon, disclaim, or dedicate to the public any such subject matter by its disclosure in this document.

Furthermore, it will be appreciated that for simplicity and clarity of illustration, where considered appropriate, reference numerals may be repeated among the figures to indicate corresponding or analogous elements. Figures illustrating different embodiments may include corresponding reference numerals to identify similar or corresponding components or elements. In addition, numerous specific details are set forth in order to provide a thorough understanding of the example embodiments described herein. However, it will be understood by those of ordinary skill in the art that the example embodiments described herein may be practiced without these specific details. In other instances, well-known methods, procedures, and components have not been described in detail so as not to obscure the example embodiments described herein. Also, the description is not to be considered as limiting the scope of the example embodiments described herein.

It should also be noted that the terms "coupled" or "coupling" as used herein can have several different meanings depending in the context in which the term is used. For example, as used herein, the terms "coupled" or "coupling" can indicate that two elements or devices can be directly coupled to one another or indirectly coupled to one another through one or more intermediate elements or devices via an electrical element, electromagnetic element, electrical signal, or a mechanical element such as but not limited to, a wire or cable, for example, depending on the particular context. Elements and devices may also be coupled wireless to permit communication using any wireless communication standard. For example, devices may be coupled wirelessly using Bluetooth communication, WiFi or another standard or proprietary wireless communication protocol.

It should be noted that terms of degree such as "substantially", "about", and "approximately" as used herein mean a reasonable amount of deviation of the modified term such that the end result is not significantly changed. These terms of degree should be construed as including a deviation of the modified term if this deviation would not negate the meaning of the term it modifies.

Furthermore, the recitation of any numerical ranges by endpoints herein includes all numbers and fractions subsumed within that range (e.g., 1 to 5 includes 1, 1.5, 2, 2.75, 3, 3.90, 4, and 5). It is also to be understood that all numbers and fractions thereof are presumed to be modified by the term "about" which means a variation up to a certain amount of the number to which reference is being made if the end result is not significantly changed.

As stated in the background section, impedance spectroscopy has found increasing wide-spread application as a non-invasive, and non-intrusive technique for monitoring state and health properties of various electrical, electrochemical, and biological loads.

During impedance spectroscopy, a load is injected (e.g., interrogated or perturbed) with one or more alternating-current (AC) signals characterized by different frequencies, or having different frequency components. At each applied frequency, the voltage and current response of the load is measured and the impedance (or complex resistance) of the load is determined in accordance with Equation (1):

$$Z(\omega) = \frac{\hat{E}(\omega)}{\hat{I}(\omega)} \qquad (1)$$

wherein $Z$ is the impedance of the load as a function of the applied frequency ($\omega$), $\hat{E}$ is the measured potential across the load, and $\hat{I}$ is the measured current flowing through the load.

A load impedance spectrum may then be generated by plotting the calculated impedance response as a function of the applied frequencies ($\omega$). In various cases, the impedance spectrum is plotted in the form of a real impedance versus complex impedance plot or a Bode plot.

The impedance data (plotted as a spectrum or in raw form) often provides valuable information regarding electrical, physical, chemical, and biological properties of the load. For example, in many cases, the load's impedance spectrum is compared against an ideal (or expected) impedance spectrum to diagnose faults in the load's performance. In other cases, the impedance spectrum may be used to generate an equivalent circuit model of the load (e.g., a small signal model), which provides insights regarding the load's operation, as well as the load's physical or electrical structure. In various cases, the equivalent circuit model may also be used to validate physics-based theoretical models of the load which are derived from first principles.

Electrical loads which may be the subject of impedance spectroscopy include, for example, motors, generators, capacitors, cables, inductors, or transformers.

Impedance spectroscopy may also be performed on electrochemical loads in a technique known as electrochemical impedance spectroscopy (EIS). Electrochemical loads may include, for example, batteries (e.g., rechargeable batteries), fuel cells, electrolyzers, as well as membranes employed in membrane-based waste water treatment (e.g., reverse osmosis (RO) membranes). In various cases, EIS may be used to measure various physical phenomena that occur over varying time scales within the electrochemical loads. For instance, EIS may be used for measuring fast phenomena that occur within the electrochemical load over shorter time scales (such as electron transfer), or slower phenomena that occur within the load over longer times scales (such as corrosion). In various cases, for example, EIS may be used to determine the state of charge of a battery, electrochemical reactions occurring within batteries and fuel cells (e.g., diffusion and charge-transfer), corrosion of metals, feed flow and recovery rates of membranes used in wastewater treatment, as well as organic and inorganic fouling of these membrane. Other properties of electrochemical loads which may also be determined using EIS include: solution resistance, electrode morphology, double-layer capacitance, charge-transfer resistance, and coating capacitance.

In other cases, impedance spectroscopy may be performed on biological loads in a technique known as bio-impedance spectroscopy. For example, impedance spectroscopy may be used on biological loads such as cells or membranes to determine cell and/or membrane structure, composition, and density.

In various cases, different frequency ranges are required in order to evaluate or model different properties of a load. For example, and as stated previously, in some cases, low frequency ranges are used for evaluating physical load phenomena which occur over longer time scales, while high frequency ranges are useful for evaluating physical load phenomena which occur over shorter time scales. For instance, examples of applications requiring the use of high frequency ranges may include measurement of solution resistance, as well as measurement of the dielectric of materials (e.g., especially at industrial scales). Other applications which require the use of lower frequency ranges may include the measurement of corrosion effects. Accordingly, it is often necessary to interrogate a load using a wide range of frequencies in order to evaluate phenomena over a wide range of time scales and to generate an impedance spectrum containing sufficient information.

In conventional systems for impedance spectroscopy which are used in industrial applications, a load is coupled to a power converter, such as a switch-mode power supply (SMPS). The SMPS may be configured to convert regulated or unregulated power to a desired regulated DC voltage output for powering the load. In other cases, the SMPS may convert a regulated DC input voltage into a desired regulated DC output voltage. To effect the conversion, the converter includes a switching device (e.g., a metal-oxide semiconductor field effect transistor (MOSFET), or an insulated-gate bipolar transistor (IGBT)) which alternates between an ON mode and an OFF mode according to a switching frequency. The switching of the transistor device results in a small AC ripple which is imposed over the DC output. When employed in impedance spectroscopy, the switching frequency is varied to generate different frequencies of AC signals. The load's impedance response is then determined as a function of the applied AC frequency.

Conventional industrial impedance spectroscopy systems, however, suffer from a number of drawbacks. For example, the maximum usable output AC ripple frequency, generated by the power converter, is limited to the Nyquist rate (e.g., half the switching frequency). Further, the effective or functional bandwidth of AC ripple frequencies generated by the spectroscopy system (e.g., the bandwidth which avoids issues, such as sampling aliasing) is typically only one-tenth of the Nyquist rate. Accordingly, standard industrial SMPS devices that are configured for maximum switching frequencies of 10 KHz to 300 KHz may only generate an effective bandwidth of AC ripple frequency of between 0.5 KHz to 15 KHz. As a result, determining load impedance data at high frequency ranges may not be possible using only the limited effective frequency bandwidth that is generated using these power converter. Further, and in many cases, as the AC ripple is dependent on the switching frequency of the power supply, conventional industrial spectroscopy systems offer limited control over the amplitude, phase and frequency components of the output AC ripple.

A further drawback is that operating power converters at high switching frequencies may also result in significant power loss. For example, the switching loss of a transistor increases in proportion to the switching frequency, and may be significant at very high frequency (VHF) ranges (e.g., megahertz (MHz) ranges). Switching loss can impair the efficiency of the power converter, and may result in the transistor generating excessive heat (e.g., which may cause the converter to require a larger heat sink).

Still a further drawback of conventional industrial impedance spectroscopy systems is the inverse correlation between the power level of the converter and the maximum switching frequency. In particular, when the power supply is used for powering large loads, the power supply might be restricted to switching to low (5-30 kHz) switching frequencies due to a lack of available components that can manage both the level of power demand (power rating) of the load as well as the operation of the converter at the higher frequency. Accordingly, the frequency ranges generated by the industrial spectroscopy system may be limited by the power level of the converter.

In view of the foregoing, and in various embodiments described herein, there is provided a load analysis signal generator which is configured to generate load analysis signals having frequencies, or frequency components, within a wide frequency range. In at least one example application, the signal generator may be used in impedance spectroscopy for determining the impedance properties of a load over a wide frequency spectrum. In other example applications, the load analysis signal generator may be also used to impose sinusoidal or transient changes to a load that may have positive effects (e.g., improvements) to the functioning or operation of the load system.

As explained in further detail herein, the load analysis signal generator includes a multi-winding transformer having at least one primary winding, and at least one secondary winding. The at least one primary winding is in series connection between a DC power supply and an interrogated load. A DC current—generated by the DC power supply—flows across the at least one primary winding to power the load. In various cases, DC current flowing across the at least one primary winding may result in an accumulation of DC flux in the core of the transformer, which may otherwise saturate the core. Accordingly, the at least one secondary winding of the transformer is coupled to a variable DC generator (also referred to herein as a "de-biasing" voltage source). The "de-biasing" voltage source generates an inverse DC "de-biasing" current across the secondary winding which is configured to eliminate, or reduce, the accumulated DC flux in the core of the transformer. The "de-biasing" current minimizes power loss in the transformer and maintains the transformer's efficiency. The at least one second secondary winding of the transformer is then also coupled to a variable AC generator that generates (or induces) one or more load analysis signals across the at least one primary winding. The load analysis signals superimpose over the DC current (i.e., in the primary winding), and the combined currents are injected into the load. In various cases, the frequency of the load analysis signals may be varied and the impedance properties of the load may be determined at different frequencies of the load analysis signal. In other cases, the load analysis signal may include more than one frequency component, and the impedance response of the load may be determined in relation to each frequency component.

The load analysis signal generator, which is provided herein, overcomes a number of the deficiencies inherent in conventional industrial impedance spectroscopy systems. In particular, as the signal generator does not rely on the main power converter's (SMPS) switching devices to vary the frequency of AC signals injected into the load, the signal generator is configured to generate high frequency signals without being capped at the Nyquist rate (e.g., the signal generator is not limited to an effective bandwidth of one-tenth of the Nyquist rate of the main power converter). Further, as the signal generator does not rely on varying the switching frequency to vary the frequency of the AC signal, the signal generator is also configurable, in various embodiments, to vary the amplitude, phase and frequency components of the AC signal. Still further, the signal generator may achieve high frequency AC outputs with minimal to no power loss (e.g., switching loss). The signal generator is also configurable to de-couple the inverse correlation which exists in conventional industrial spectroscopy systems as between the power demand of the load and the maximum switching frequency of the spectroscopy system (e.g., the signal generator is able to produce high frequency AC signals independent of the power demand of the load). In this manner, the signal generator is configured for use in broadband impedance spectroscopy in order to generate high resolution impedance data over an extended frequency range. This may allow for assessing a wide range of physical phenomena of a load (e.g., electrical, chemical, physical, and biological properties) that occur over short or long time scales and are determined when the load is perturbed using a wide range of frequency signals.

Figure 1:
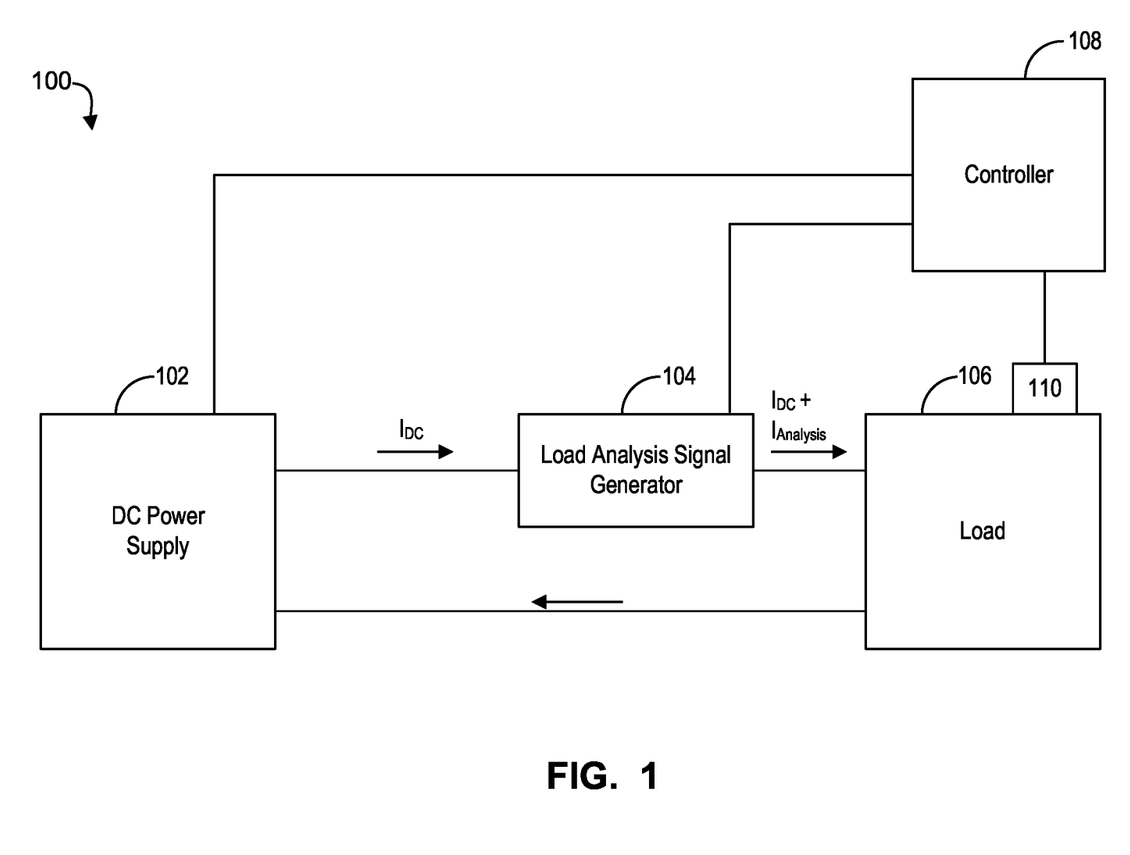
FIG. 1 illustrates a simplified block diagram of a load impedance determining system, according to some embodiments.

Referring now to FIG. 1, there is shown a simplified block diagram for a load impedance determining system 100 according to some embodiments. As shown, the system 100 generally includes a DC power supply 102, a load analysis signal generator 104, and a load 106. In at least some embodiments, the system 100 may also include a controller 108.

The DC power supply 102 may be any suitable power supply that is configured to supply DC current ($I_{DC}$) in order to power the load 106 (e.g., a DC voltage source). In various embodiments, the DC power supply 102 may also include a power converter which converts unregulated AC or DC input voltage (e.g., from a voltage source, or power grid) to a regulated DC voltage output based on the power demands of the load 106. For example, in some cases, the DC power supply 102 can include a switch-mode power supply (SMPS) which uses a buck, boost, or a buck and boost circuit topology (e.g., a galvanically isolated or non-isolated circuit topology) to generate a regulated DC voltage output.

The load analysis signal generator 104 is coupled in series between the power supply 102 and the load 106. As explained in further detail herein, the signal generator 104 is configured to generate a sinusoidal AC signal (also referred to herein as a "load analysis signal" ($I_{Analysis}$)) which is superimposed over the DC current ($I_{DC}$). The combined AC and DC signals ($I_{DC}+I_{Analysis}$) are injected into the load 106.

In various embodiments, the signal generator 104 may be configured to generate different load analysis signals which oscillate at different frequencies. For example, where the system 100 is used in impedance spectroscopy, the signal generator 104 may inject the load 106 with various frequency load analysis signals, and may determine the impedance response of the load at each applied frequency. In at least some embodiments, the signal generator 104 may also be configured to generate load analysis signals within a wide frequency range (e.g., extending up to a megahertz (MHz) range) to provide for high resolution impedance spectrum data. In other embodiments, rather than generating multiple load analysis signals, the signal generator 104 may generate a single load analysis signal having multiple frequency components (also known as a mixed-frequency signal, or a multi-sine signal). The impedance response of the load may then be determined in relation to each applied frequency component.

Load 106 is any suitable physical load which is the subject of impedance measurements. For example, where the system 100 is applied in electrochemical impedance spectroscopy (EIS), the load may be a battery, a fuel cell, or an electrolyzer. The load may also be a membrane which is employed in membrane-based wastewater treatment (e.g., a reverse-osmosis (RO) membrane). In other cases, the load may be an electroflotation, electrocoagulation, electroxidation and/or electrocoagulation water treatment cell. In at least some cases, the load 106 may be coupled to the system 100 using one or more electrodes. For instance, the load 106 may be positioned between two electrodes configured to apply the combined DC and AC voltage (i.e., generated by the power supply 102, and load analysis generator 106).

In various embodiments, one or more sensors 110 may couple to the load 106. The sensors 110 may provide data and/or information to the controller 108 for use in determining the impedance response of the load 106 to various frequency load analysis signals (or load analysis signals which include different frequency components). For example, in some embodiments described herein, the sensor 110 may be a voltage or current sensor that is configured to measure the AC voltage differential or current across the load 106. For example, the voltage differential, in conjunction with a known value and frequency for the load analysis signal ($I_{Analysis}$), may be used by the controller 108 to determine the impedance response of the load in accordance with Equation (1).

Controller 108 may be provided for controlling the various components of the system 100.

In at least some embodiments, the controller 108 may couple to the load analysis signal generator 104. The controller 108 may then control the frequencies and/or amplitudes of the load analysis signals generated by the signal generator 104. For example, in some cases, the controller 108 may direct the signal generator 104 to generate a pre-determined number of load analysis signals having pre-determined frequencies within a pre-determined frequency range. In other cases, the controller 108 may direct the signal generator 104 to generate a single load analysis signal having a pre-determined number of frequency components. The controller 108 may also control the time span of each load analysis signal, as well as the time-interval between consecutive load analysis signals.

In other embodiments, the controller 108 may further couple to the sensor 110. The controller 108 may receive data measurements (e.g., voltage and current measurements) from the sensor 110, and may use the data measurements to determine the impedance response of the load 106. The controller 108 may also be further generate an impedance spectrum of the load 106 based on the load's impedance response at different applied frequencies.

In still other embodiments, the controller 108 may couple to the DC power supply 102. In particular, where the DC power supply 102 includes a power converter with a switching device, the controller 108 may adjust the switching frequency of the switching device to adjust the AC ripple frequency generated by the power converter (e.g., to minimize the AC ripple). In other cases, the controller 108 may adjust the duty cycle of the power converter (and in some cases, the switching frequency) to vary the regulated DC output generated by the power converter in order to accommodate for the varying power demands of load 106.

As explained in further detail herein, the controller 108 may also couple to one or more sensors which are configured to measure either the DC current ($I_{DC}$) flowing across the signal generator 104, or other parameters which relate to the DC current ($I_{DC}$).

Figure 2A:
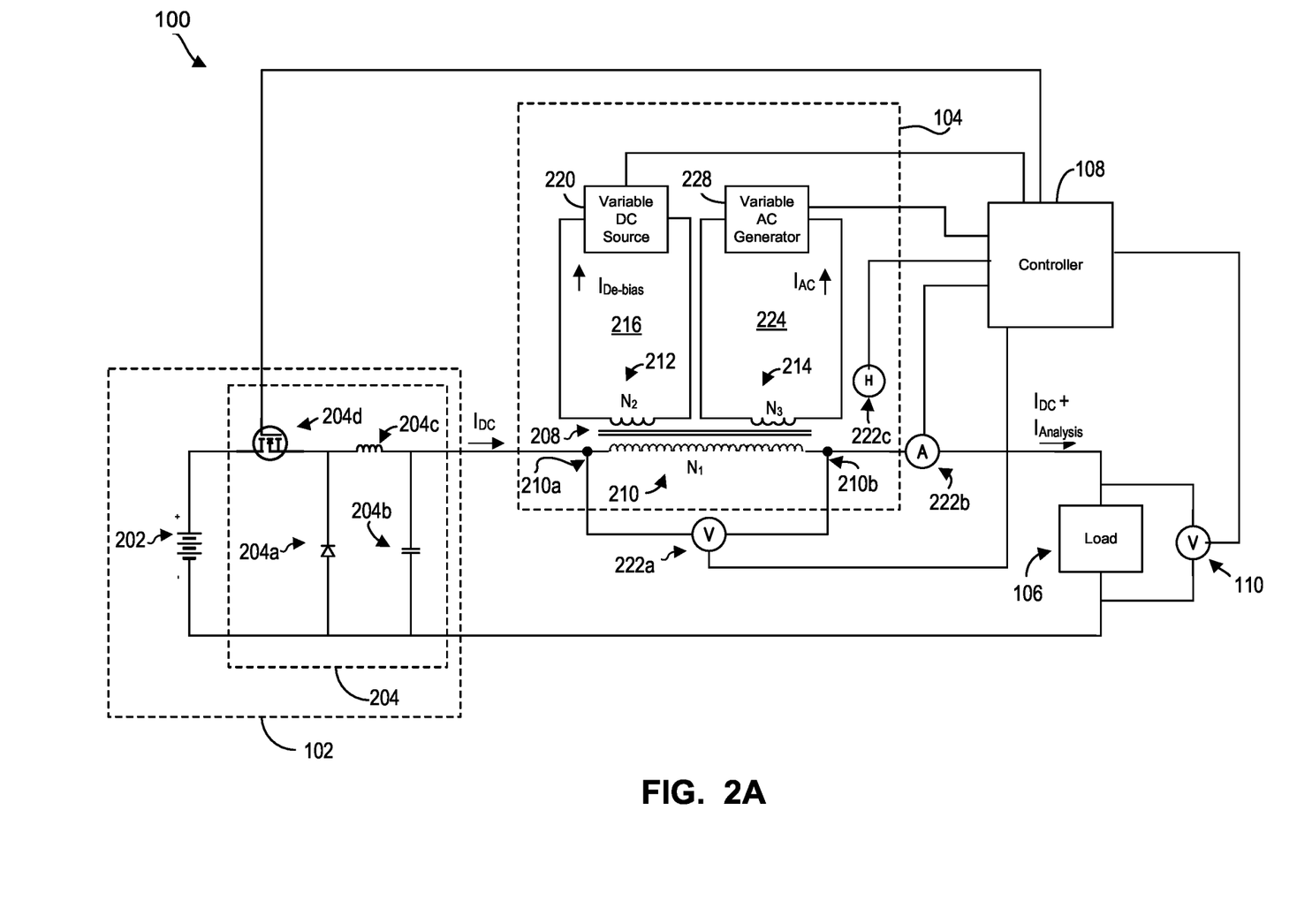
FIG. 2A illustrates a simplified circuit diagram of the load impedance determining system of FIG. 1, in accordance with some embodiments.

Referring now to FIG. 2A, there is shown a simplified circuit diagram for the load impedance determining system 100 of FIG. 1, according to some embodiments.

As shown, the DC power supply 102 may include a DC voltage source 202 for powering the load 106. In some cases, the DC power supply 102 may also include a power converter 204 (e.g., an SMPS) which is coupled to the DC voltage source 202. In the illustrated embodiment, the power converter 204 is a DC/DC buck converter which is configured to step down an input voltage received from the DC voltage source 202. The buck converter 204 includes a forward-biased diode 204a in parallel arrangement with a capacitor 204b and an inductor 204c coupled between the forward-biased diode 204a and the capacitor 204b. In other cases, the buck converter 204 may be a synchronous buck converter and may include a MOSFET in place of the diode 204a. In still other cases, the buck converter can have any one of a number of suitable circuit topologies. In the illustrated example, a transistor (e.g., a MOSFET) 204d is provided for switching the converter 204 between an ON mode and an OFF mode. The transistor 204d includes a drain node that is coupled to the DC voltage source 202, and a source node that is coupled to a shared node common to both the diode 204a and the inductor 204c. The transistor 204d also includes a gate node, which in some embodiments, is coupled to the controller 108. The controller 108 may control the switching frequency of the transistor 204d by transmitting a pulse width modulated (PWM) signal to the gate node, which in turn, controls the transistor's operational state. In some cases, a gate driver may be located between the controller 108 and the gate node of transistor 204d in order to transform the control signal from controller 108 into a voltage signal for controlling the gate node. As mentioned previously, the controller 108 can control the transistor 204d to vary the duty cycle of the power supply 102 based on the power demands of the load 106. In some cases, the controller 108 may also vary the switching frequency of the transistor 204d to change the oscillating frequency of an AC ripple generated by the power converter. It will be appreciated that the illustrated circuit topology for the power converter 204 has only been shown herein by way of example, and that other suitable circuit topologies may be employed.

Still referring to FIG. 2A, the DC power supply 102 is configured to generate a near steady-state DC current output ($I_{DC}$), which in some cases, may include a small AC switching ripple. The DC current ($I_{DC}$) is fed to the load analysis signal generator 104.

In various embodiments, the load analysis signal generator 104 is formed from a multi-winding transformer 208 which includes at least one primary-side winding 210 having $N_1$ winding turns, and at least one secondary winding. In the illustrated example embodiment, the at least one secondary winding includes a first secondary-side winding 212 having $N_2$ turns, and a second secondary-side winding 214 having $N_3$ turns. In other embodiments, the first and secondary-side windings may be combined into a single secondary winding. In still other embodiments, the primary-side winding may comprise, for example, a first primary-side winding and a second primary-side winding.

The primary winding 210 is coupled in series between the DC power supply 102 and the load 106. The primary winding 210 includes an input node 210a coupled to the output of the DC power supply 102, and an output node coupled to the load 106. DC current ($I_{DC}$), from the DC power supply 102, accordingly flows across the primary winding 210 to power the load 106.

The first secondary winding 212 is coupled in series to a de-biasing circuit 216, which includes a variable DC voltage generator 220 (also referred to herein as a "de-biasing" voltage source 220). In particular, the de-biasing circuit 216 is configured to eliminate the DC magnetic flux that may be generated in the transformer core as a result of the DC current ($I_{DC}$) flowing across the primary winding 210. In this manner, the de-biasing circuit 216 ensures that the transformer 220 does not enter into saturation, and accordingly, does not suffer from reduced efficiency, increased power loss, degradative mechanisms (e.g., increased risk of transformer overheating), or otherwise results in an open circuit which renders the system non-operational.

To de-bias the transformer core, the variable DC generator 220 generates an inverse DC current (also referred to herein as a de-biasing current ($I_{DE-BIAS}$)) across the secondary winding 212. The de-biasing current ($I_{DE-BIAS}$) is configured to be equal in magnitude (but inverse in direction) to the DC current ($I_{DC}$) and in proportion to the turns ratio of the first and secondary windings, in accordance with Equation (2):

$$I_{De-bias} = \frac{N_1}{N_2} I_{DC} \qquad (2)$$

The de-biasing current ($I_{DE-BIAS}$) generates a reverse flux in the transformer core which eliminates, or reduces, the flux bias generated by the DC current ($I_{DC}$) flowing across the primary winding. Accordingly, the DC current ($I_{DC}$) may flow across the primary winding without saturating the transformer 208. In various cases, the de-biasing current may generate the reverse flux by configuring the variable DC generator 220 to generate the de-biasing current ($I_{DE-BIAS}$) to flow in the opposite direction as the DC current ($I_{DC}$). In other cases, the de-biasing current ($I_{DE-BIAS}$) may flow in the same direction as the DC current ($I_{DC}$), but the secondary winding 212 may be wound in the reverse direction as the primary winding 210 in order to generate the reverse flux.

In various embodiments, the variable DC generator 220 may couple to the controller 108, which is configured to control the de-biasing current ($I_{Dc-bias}$) generated by the DC generator 220. For example, in at least some cases, the controller 108 may determine the necessary de-biasing current ($I_{De-bias}$) based on the amount of DC current ($I_{DC}$) flowing through the primary winding 210. For example, in the illustrated embodiment, the controller 108 is coupled to one or more sensors 222 which provide data regarding the DC current ($I_{DC}$) flowing across the primary winding 210. The controller 108 processes the data received from the sensors 222 and determines the appropriate de-biasing current ($I_{Dc-bias}$). The controller 108 may then adjust the variable DC generator 220 to generate the determined appropriate de-biasing current ($I_{Dc-bias}$). In this manner, the controller 108 may form part of a feedback loop which modifies the de-biasing voltage (or current) source 220 based on data from sensors 222.

Various sensors 222 may be coupled to the controller 108 for use in determining the DC current ($I_{DC}$) flowing across the primary winding 210. For example, in the illustrated embodiment, the controller 108 may couple to a voltage sensor 222a connected in parallel to the primary winding 210 (i.e., between the input node 210a and the output node 210b). The voltage sensor 222a may measures the differential DC voltage across the primary winding 210 and may transmit the measured voltage reading to the controller 108. The controller 108 may then determine the DC current ($I_{DC}$) flowing across the primary winding 210 based on the voltage reading and a known impedance of the primary winding 210.

In other embodiments, the controller 108 may couple to a current sensor 222b which is in series connection between the output node 210b, of the primary winding 210, and the load 106. The current sensor 222b may directly measure the DC current ($I_{DC}$) flowing across the primary winding 210 and may transmit this information to the controller 108. Accordingly, the controller 108 may determine the DC current ($I_{DC}$) across the primary winding directly from the data received from the current sensor 222b. In other embodiments, the current sensor 222b may also be positioned between the DC power supply 102 and the input node 210a (of the primary winding), as well as after the load 106. In various cases, the current sensor 222b may also measure AC current (e.g., $I_{Analysis}$), and also transmit this measurement information to the controller 108.

In still yet other embodiments, a hall effect sensor 222c may be located proximate the transformer 208. The hall effect sensors 222c may measure the level of DC magnetic flux present in the transformer 202, and may generate a voltage reading of the recorded flux. The controller 108 may receive the voltage reading from the hall effect sensor 222d, and may adjust the de-biasing voltage source 220 with a view to eliminating, or reducing, the measured DC flux in the transformer core.

In various cases, the sensors 222 may be configured to transmit information on a continuous basis, or periodically at pre-defined time intervals, to the controller 108. In other cases, the sensors may only transmit readings in response to the occurrence of certain events. For example, the sensors may transmit readings only when a change (or a significant change) is detected in a monitored parameter. In still other cases, the sensors may transmit information only at the request of the controller 108.

It will be appreciated that the sensor configuration illustrated in FIG. 2A has only been shown herein by way of example, and that other sensors and/or sensor configurations may be used for determining the DC current ($I_{DC}$) flowing across the primary winding 210.

In still other embodiments, the variable DC generator 220 may not be coupled to the controller 108, and may be pre-configured to generate a "de-biasing" current ($I_{De-bias}$) based on a known value for the DC current ($I_{DC}$), as well as a known turns ratio $N_2:N_1$ between the primary and secondary windings.

Referring still to FIG. 2A, the second secondary winding 214 is coupled in series to a load analysis injection circuit 224, which includes a variable AC signal generator 228 (also referred to herein as a load analysis signal source 228).

The load analysis signal source 228 is configured to generate a time-varying AC signal ($I_{AC}$) across the secondary winding 214. The AC signal ($I_{AC}$) flows across the secondary winding 214, and in turn, generates the load analysis signal ($I_{Analysis}$) across the primary winding 210. The load analysis signal is equal in frequency to the AC signal ($I_{AC}$), and is otherwise related to the AC signal in accordance with Equation (3):

$$I_{Analysis} = \frac{N_3}{N_1} I_{AC} \quad (3)$$

The load analysis signal ($I_{Analysis}$) is superimposed over the DC current ($I_{DC}$) in the primary winding 210 to generate a combined AC and DC signal (i.e., $I_{DC}+I_{Analysis}$) that is injected into the load 106.

In various embodiments, the variable AC generator 228 may be configured to generate load analysis signals at variable frequencies, phrases and/or amplitudes. For example, where the system 100 is used in impedance spectroscopy, the AC generator 228 may generate a plurality of load analysis signals, each having different frequencies. The load analysis signals may be then separately injected into the load 106, and the impedance response of the load, at each frequency, may be individually determined, i.e., to generate an impedance spectrum. In other embodiments, the variable AC generator 228 may generate a single load analysis signal having multiple frequency components.

In at least some embodiments, the AC generator 228 may generate load analysis signals at high frequency ranges (or having high frequency components) which, in turn, allows for the impedance response of the load 106 to be determined over a wide frequency range. In particular, this allows for assessing electrical, chemical, biological and physical properties of the load 106 that are only determined when the load is perturbed using high frequency signals (e.g., including membrane properties, and bulk and surface resistance).

As previously mentioned, the maximum frequency output of the AC signal generator 228 is not otherwise capped by the Nyquist rate of the DC power supply 102. Additionally, the AC generator 228 may generate high frequency load analysis signals without suffering from consequent power loss (e.g., switching loses), which may otherwise hamper the performance of conventional industrial impedance spectroscopy systems. Accordingly, the AC generator 228 is able to effectively generate high resolution impedance spectroscopy data over large frequency bandwidths.

In at least some embodiments, the AC generator 228 may further couple to the controller 108. The controller 108 may control the frequencies of the load analysis signals generated by the AC generator 228. For example, the controller 108 may control the AC generator 228 to generate a pre-determined number of discrete load analysis signals at pre-determined frequencies within a pre-determined frequency range. The impedance response of the load 106 may then be separately determined at each applied frequency. The controller 108 may also specify the time-interval between when consecutive load analysis signals are generated and injected into the load 106. Accordingly, this may allow sufficient time for injecting each load analysis signal into the load 106, and calculating the resultant impedance response of the load. In still other cases, rather than generating multiple AC signals at multiple frequencies, the controller 108 may direct the AC signal generator 228 to generate a single mixed-frequency AC signal having a range of low and high frequency components.

In at least some cases, the AC generator 228 may not be coupled to the controller 108, and may be pre-configured to automatically generate various load analysis signals at pre-determined frequencies and at pre-determined time intervals. Additionally, or in the alternative, the AC generator 228 may also be pre-configured to generate one or more load analysis signals with multiple pre-determined frequency components.

In order to determine the impedance response of the load at different applied frequencies of load analysis signals (or load analysis signals with different frequency components), the controller 108 may couple to the sensor 110 and received data therefrom.

In the illustrated embodiment, the sensor 110 is a voltage sensor which is connected in parallel arrangement to the load 106. The voltage sensor measures the differential AC voltage across the load 106 in response to an applied load analysis signal, and transmits the voltage reading to the controller 108. The controller 108 may then determine the impedance response of the load using the voltage reading, as well as known information regarding the magnitude and frequency of the injected load analysis signal ($I_{Analysis}$) (e.g., in accordance with Equation (1)).

In some cases, where the load 106 is injected with a single load analysis signal having several frequency components, the controller 108 may be configured to de-compose the AC voltage reading—received from the voltage sensor 110—into its various frequency components using any appropriate spectral and/or frequency decomposition method (e.g., a Fast Fourier Transform (FFT), or a Discrete Fourier Transform (DFT)). The controller 108 may then separately analyze the impedance response of the load to each applied frequency component.

Figure 2B:
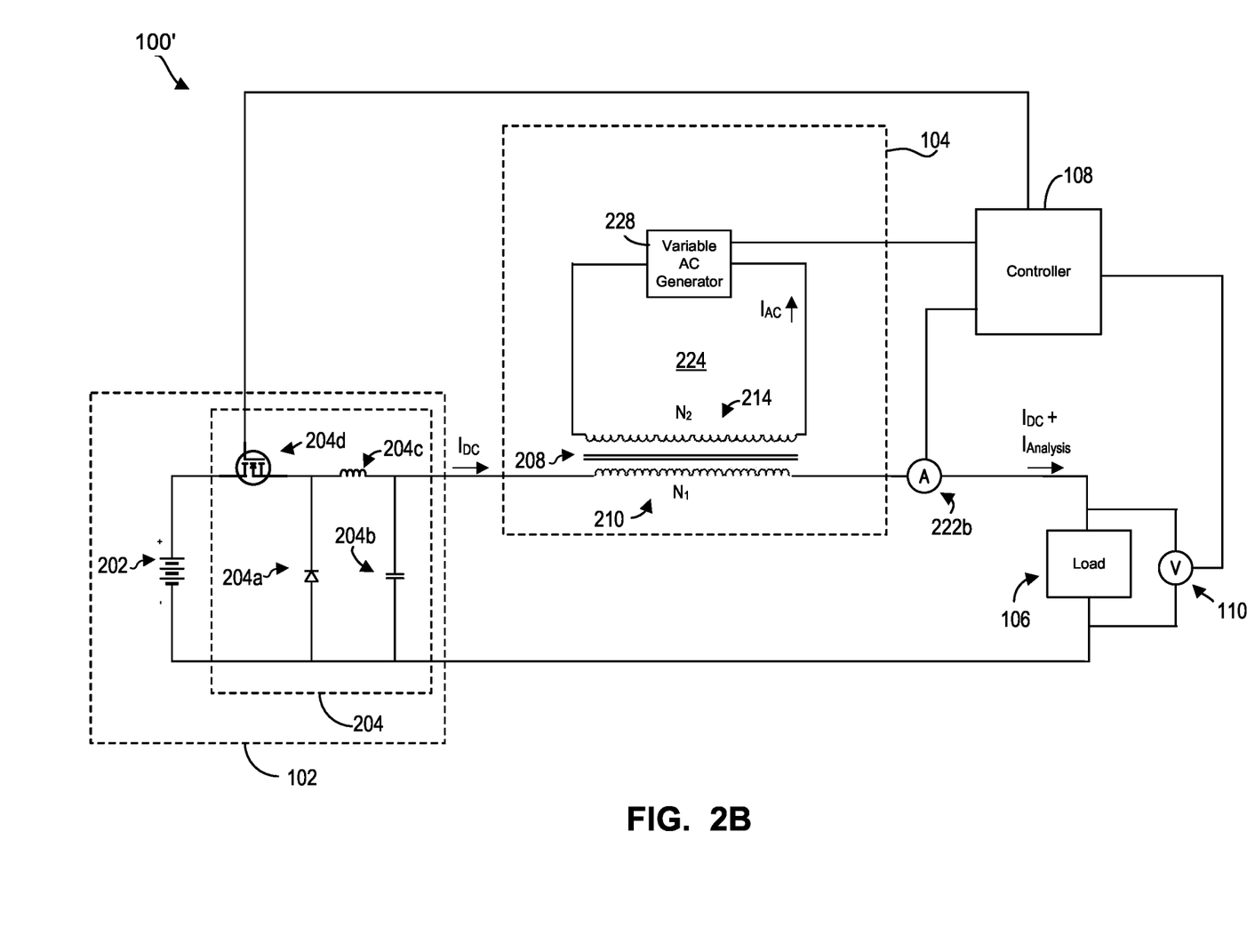
FIG. 2B illustrates a simplified circuit diagram of the load impedance determining system of FIG. 1, in accordance with another embodiment.

Referring now to FIG. 2B, there is shown a simplified circuit diagram for a load impedance determining system 100' of FIG. 1, according to some other embodiments.

The load impedance determining system 100' of FIG. 2B is generally analogous to the load impedance determining system 100 of FIG. 2A with the exception that the determining system does not include a de-biasing circuit 216. Further, the transformer 208 includes only the primary-side winding 210, and a single secondary winding 214 coupled in series to the variable AC generator 228 of the injection circuit 224. In this embodiment, the transformer 208 may be selected to handle DC currents ($I_{DC}$) on the order of 10 to 10,000 Amp-turns. Accordingly, for these application, a de-biasing circuit 216 may not be required in de-biasing the transformer core and avoiding saturation.

Figure 3:
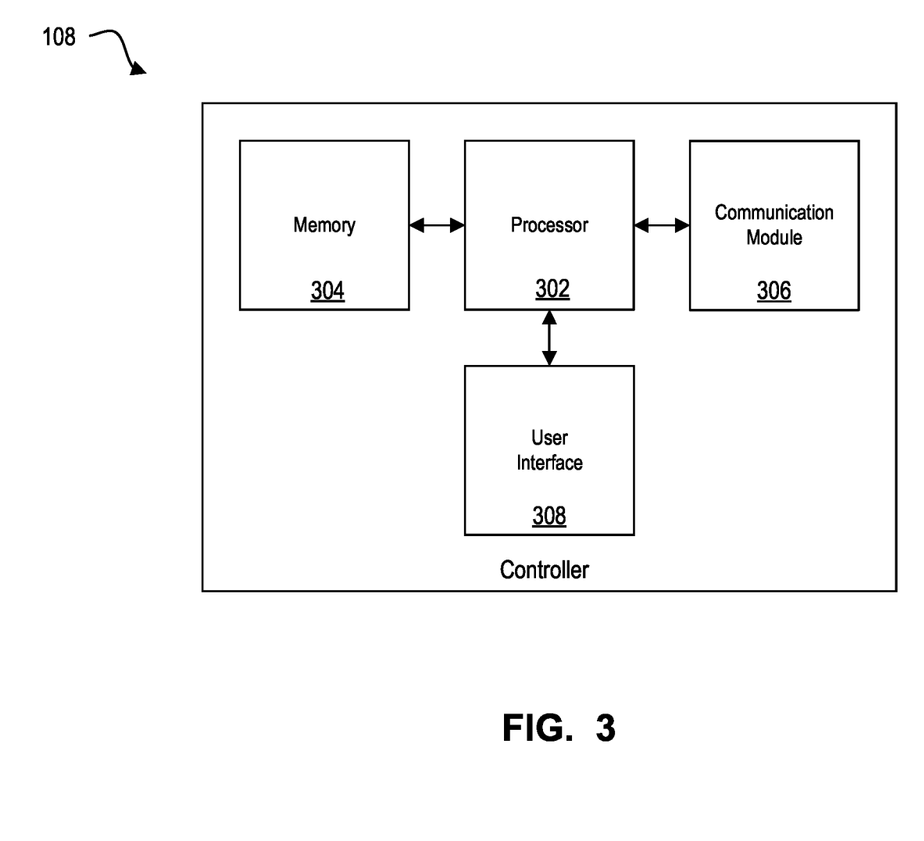
FIG. 3 illustrates a simplified block diagram of a controller used in the load impedance determining system of FIG. 1, according to some embodiments.

Referring now to FIG. 3, there is shown a simplified block diagram of the controller 108 in accordance with some embodiments.

As shown therein, the controller 108 generally includes a processor 302 in communication with a memory 304, a communication module 306, and a user interface 308.

Processor 302 may be configured to execute a plurality of instructions to control and operate the various components of the controller 108. Processor 302 may also be configured to receive information from the various components of controller 108 and to make specific determinations using this information. The determinations may then be transmitted to the memory device 304 and/or the communication module 306. For example, in various embodiments, the processor 302 may be configured to receive information, via communication module 306, from one or more of sensors 222. The processor may then use this information to determine the DC current ($I_{DC}$) flowing across the primary winding 210 of the transformer 208. Based on this determination, the processor 302 may transmit, via communication module 306, instructions to modify the de-biasing current ($I_{De-bias}$) generated by the variable DC generator 220 (i.e., to eliminate a DC flux bias in the transformer core). In other embodiments, the processor 302 may also be configured to transmit instructions, via communication module 306, to the variable AC generator 228 to generate one or more load analysis signals ($I_{Analysis}$) having different frequencies, or having different frequency components, within a pre-defined frequency range. In still other embodiments, the processor 302 may be configured to receive, via the communication module 306, voltage readings from the voltage sensor 110. The processor 302 may then determine the impedance response of the load 106 based on a known frequency of a load analysis signal injected into the load 106. In cases where a multi-sine signal (or multi-frequency signal) is injected into the load 106, the processor 302 may be further configured to de-compose the voltage reading into its separate frequency components, and accordingly, to determine the impedance response of the load in relation to each frequency component. In still yet other embodiments, the processor 302 may be configured to correlate the load's impedance response to an applied frequency in order to generate an impedance spectrum of the load over a range of frequencies.

In at least some embodiments, the instructions which are executed by the processor 302 may be transmitted from a remote terminal, and received by the processor 302 via communication module 306. In other embodiments, the processor 302 may be pre-configured with specific instructions. The pre-configured instructions may be executed in response to specific events or specific sequences of events, or at specific time intervals.

Memory 304 may be, for example, a non-volatile read-write memory which stores computer-executable instructions and data, and a volatile memory (e.g., random access memory) that may be used as a working memory by processor 302. In various embodiments, the memory 304 may be used to store determinations made by the processor 302 in respect of the impedance response of the load 106 for particular frequencies (or frequency components) of load analysis signals that are injected therein.

Communication module 306 may be configured to send and receive data, or information, to various components of the load impedance determination system 100. For example, as previously explained, the communication module 306 may receive data from one or more of sensors 222 and voltage sensor 110 of the system 100. In other cases, the communication module 306 may be configured to transmit instructions to the variable DC generator 220 and/or the variable AC generator 228. Accordingly, communication module 306 can be configured to provide two-way bi-directional communication. In still other embodiments, the communication module 306 may be configured to send and receive data to a remote terminal. For example, the communication module 306 may transmit to the remote terminal the impedance response of the load 106 to one or more applied load analysis signals. This information may be transmitted in real-time, or near-real time, to allow an operator of the remote terminal to monitor the state and health of the load 106 and to take immediate corrective action if a fault is detected in the load 106. The communication module 306 may also receive instructions from the remote terminal. For example, an operator of the remote terminal may transmit instructions to modify the number of load analysis signals generated by the AC generator 208, the frequencies (or frequency components) of the load analysis signals generated by the AC generator 228, and/or the frequency range of the generated load analysis signals. In still other embodiments, the communication module 306 may transmit and receive data and information from an external controller (not shown) which is coupled to the load 106. For example, the external controller may be configured to modify the operation of the load 106 based on information received about the impedance response of the load 106. The communication module 306 may also transmit impedance information to the external controller in real-time, or near real time.

In various cases, the communication module 306 may, for example, comprise a wireless transmitter or transceiver and antenna. In other cases, the communication module 306 may be simply configured for wired communication. In various cases, the communication module 306 may be configured for communication over public or private wired or wireless networks.

The controller 108 may also include a user interface 308. The user interface 308 may be one or more device that allows a user, or operator, to interact with the controller 108. For example, the user interface 308 may have a keyboard or other input device that allows a user to input instructions into the controller 108 with respect to the operation of the load impedance determination system 100. For example, in some cases, the user may input instructions to control the number of load analysis signals generated by the AC generator 228, or the frequencies of the load analysis signals generated by the AC generator 228 (or the frequency components of a mixed-frequency load analysis signal). In other cases, the user may input instructions to control the frequency range of the load analysis signals generated by the AC generator 228. In still other cases, the user can control the de-biasing current ($I_{De-bias}$) generated by the variable DC generator 220. Accordingly, the user interface 306 may allow direct control of the system 100 without requiring a remote terminal.

In at least some embodiments, the user interface 308 may also include a display that allows the user to view the determined impedance response of the load 106 in response to different frequencies of load analysis signals injected into the load 106. In some cases, the display may allow the user to view the impedance response of the load in real-time, or near real time, to allow the user to monitor the state and health of the load 106, and accordingly, to take immediate corrective action if a fault is detected. The user interface 308 may further include a graphical user interface (GUI) which facilitates user interaction.

Figure 4:
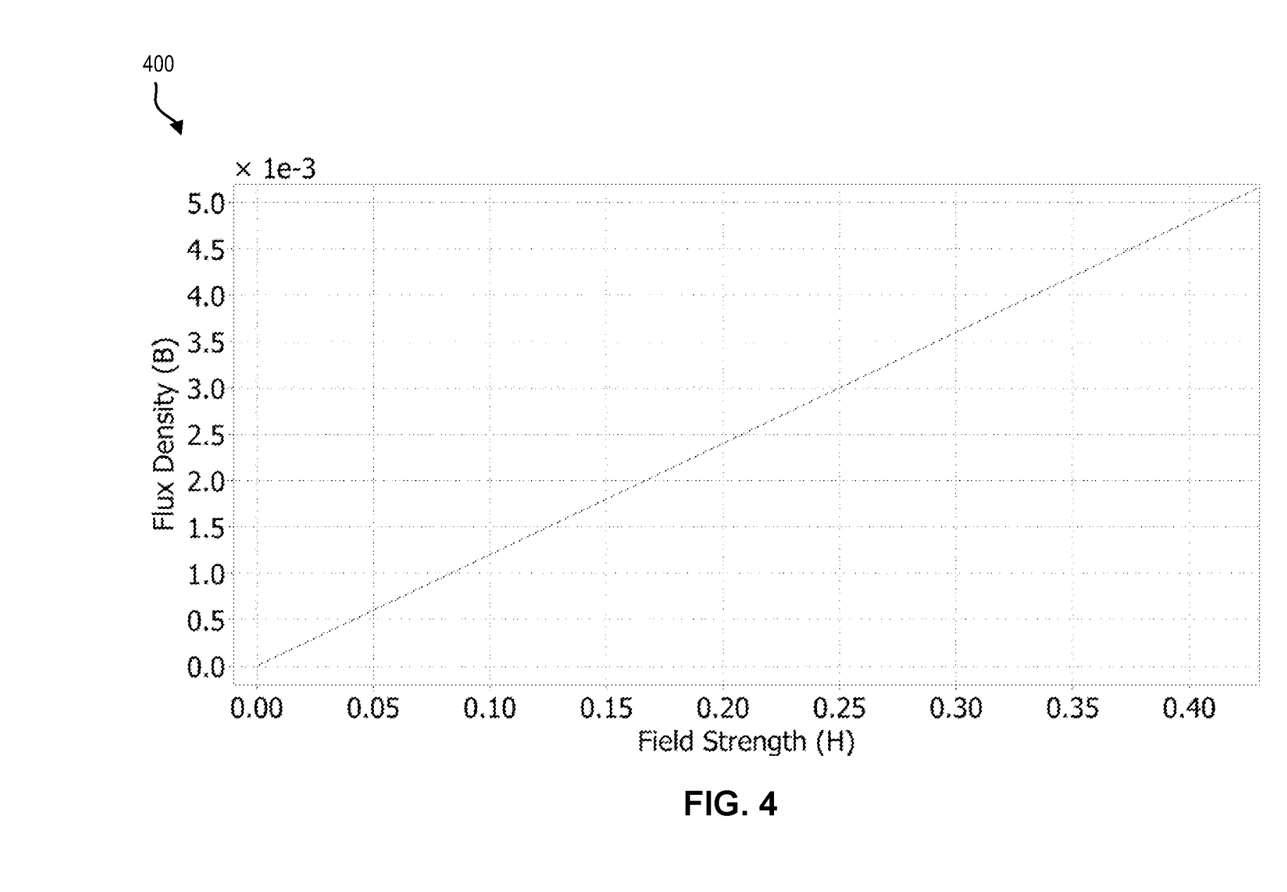
FIG. 4 illustrates a B-H curve for a transformer used in the load impedance determining system of FIG. 1.

Referring now to FIG. 4, there is shown an example B-H curve 400 of the transformer 208 of FIG. 2A. In particular, the B-H curve shows the magnetic field strength (H) as a function of the magnetic flux density (B) inside of the transformer 208 resulting from the combined effect of: (a) the DC current ($I_{DC}$) flowing through the primary winding 210 of the transformer 208, and (b) the "de-biasing" current ($I_{De-bias}$) flowing through the secondary winding 212. In particular, as shown, the B-H plot stays strictly within the linear region of the transformer's B-H curve, and does not otherwise saturate. Accordingly, the "de-biasing" current ($I_{De-bias}$) is able to effectively ensure that the transformer operates in the ideal zone, and does not other wise suffer from a loss of efficiency. This, in turn, allows for effective operation of the load analysis signal generator 104 to inject AC signals into the load 106.

Figure 5:
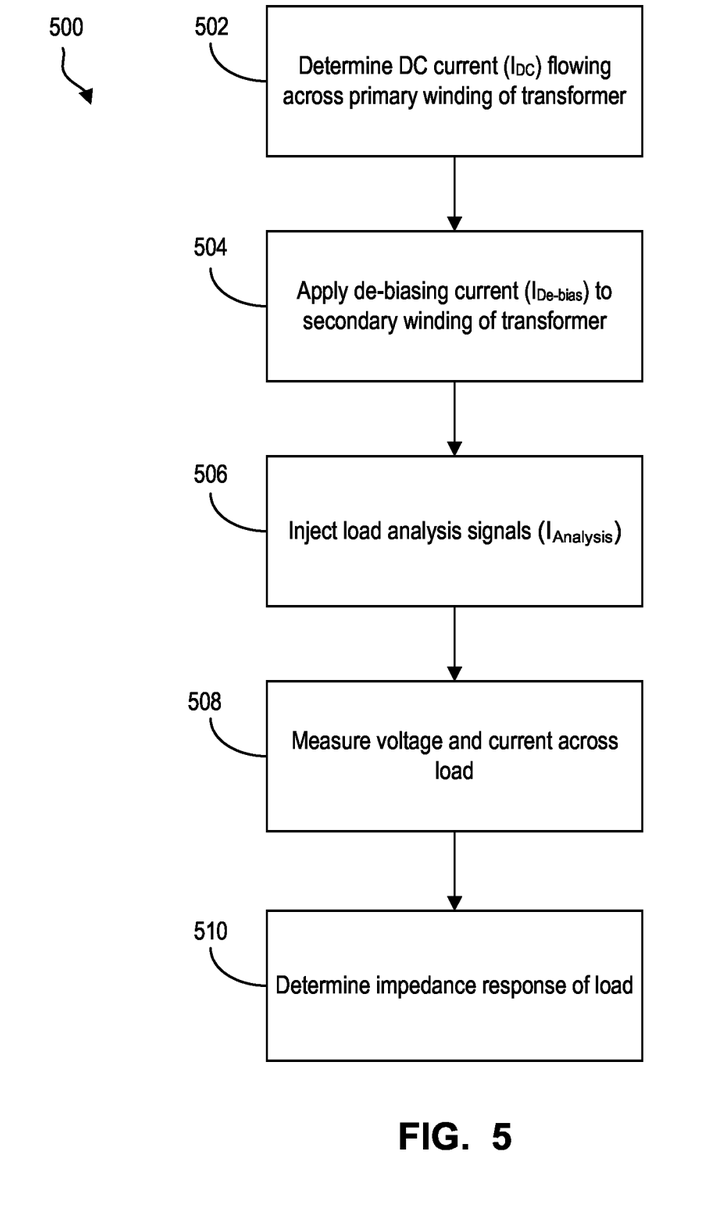
FIG. 5 is a process flow showing an example process for determining the impedance properties of a load, according to some embodiments.

Referring now to FIG. 5, there is shown a process flow for an example method 500 for determining the impedance properties of the load 106. The method 500 can be carried out, for example, using processor 302 of the controller 108 in FIG. 3.

At 502, the DC current ($I_{DC}$) flowing across the primary winding 210 of the transformer 208 is determined. As stated previously, the DC current ($I_{DC}$) may be determined using information received from one or more sensors 222 in FIG. 2A.

At 504, the de-biasing current ($I_{De-bias}$) is determined in accordance with Equation (3) and is applied by the variable DC generator 220 across the secondary winding 212 of the transformer 208.

At 506, the variable AC generator 228, which is coupled to the second secondary winding 214, generates one or more load analysis signals ($I_{Analysis}$) having different frequencies, or frequency components, for injection into the load 106.

At 508, the voltage and current across the load 106 may be measured. For instance the voltage may be measured using voltage sensor 110, and the current may be measured using current sensor 222b.

At 510, based on the measurements at 508, the impedance of the load 106 may be determined in response to each frequency (or frequency component) of the load analysis signals injected into the load.

The present invention has been described here by way of example only, while numerous specific details are set forth herein in order to provide a thorough understanding of the exemplary embodiments described herein. However, it will be understood by those of ordinary skill in the art these embodiments may, in some cases, be practiced without these specific details. In other instances, well-known methods, procedures and components have not been described in detail so as not to obscure the description of the embodiments. Various modifications and variations may be made to these exemplary embodiments without departing from the spirit and scope of the invention, which is limited only by the appended claims.

We claim:

1. A system for measuring properties of a load, the system comprising:
    a transformer having at least one primary winding and at least one secondary winding;
    the at least one primary winding of the transformer being couplable between a power supply and the load;
    a load analysis signal generator coupled to the at least one secondary winding, wherein the load analysis signal generator is configured for generating at least one time-varying load analysis signal across the at least one primary winding; and
    at least one processor coupled to the load analysis signal generator configured for:
        receiving at least one signal generated by at least one sensor in communication with the at least one processor as a result of the at least one time-varying load analysis signal being applied to the load; and
        determining one or more properties of the load based on the at least one signal.

2. The system of claim 1, further comprising a direct current (DC) voltage generator coupled to the at least one secondary winding, wherein the DC voltage generator is configured for generating a DC de-biasing current across the at least one secondary winding, the DC de-biasing current being used to reduce a DC flux bias generated in the transformer by a DC current flowing across the at least one primary winding, wherein the DC current is generated by the power supply to power the load.

3. The system of claim 2, wherein the de-biasing current applied to the at least one secondary winding is proportionate in magnitude to the DC current and in proportion to a turns ratio of the at least one primary and secondary windings of the transformer.

4. The system of claim 2, wherein the de-biasing current applied to the at least one secondary winding flows across the at least one secondary winding in an opposite direction to a directional flow of the DC current in the at least one primary winding.

5. The system of claim 2, wherein the at least one secondary winding comprises a first secondary winding and a second secondary winding, and wherein:
    the DC voltage generator is coupled to the first secondary winding, and the load analysis signal is coupled to the second secondary winding.

6. The system of claim 5, wherein the first secondary winding is wound in a reverse direction to a winding direction of the at least one primary winding, and the de-biasing current flows in a same direction through the first secondary winding as a direction flow of the DC current in the at least one primary winding.

7. The system of claim 1, wherein the determined one or more properties of the load includes an impedance property of the load, and the impedance property is determined at a given frequency (ω) of the at least one load analysis signal based on the equation:

$$Z(\omega) = \frac{\hat{E}(\omega)}{\hat{I}(\omega)}$$

wherein Z(ω) is the complex impedance property of the load as a result of applying the at least one load analysis signal at the frequency ω, Ê(ω) is a time-varying voltage across the load having the frequency ω, and Î(ω) is the time-varying current passing through the load as a result of applying the at least one load analysis signal having the frequency ω.

8. The system of claim 7, wherein the at least one signal received from the at least one sensor comprises one or more of:
   a voltage across the load; and
   a current passing through the load.

9. The system of claim 2, wherein the at least one signal comprises at least one first signal, and wherein:
   the DC voltage generator comprises a variable DC voltage generator coupled to the at least one processor, and the at least one processor is further configured for:
      determining, based on at least one second signal received from a at least one second sensor measuring a parameter associated with the DC current flowing across the at least one primary winding of the transformer, the DC current flowing across the at least one primary winding of the transformer; and
      based on the determination, adjusting the variable DC voltage generator to generate a corresponding DC de-biasing current.

10. The system of claim 9, wherein the corresponding de-biasing current applied to the at least one secondary winding is proportionate in magnitude to the determined DC current and in proportion to a turns ratio of the at least one primary and secondary windings of the transformer.

11. The system of claim 1, wherein the load analysis signal generator is configured to vary one or more of a frequency, phase and amplitude of the at least one load analysis signal.

12. The system of claim 11, wherein the at least one processor is operable to control one or more of the frequency, phase and amplitude of the at least one load analysis signal generated by the load analysis signal generator.

13. The system of claim 11, wherein the load analysis signal generator is configurable to generate load analysis signals having frequencies up to 1 GHz.

14. The system of claim 11, wherein the load analysis signal is configured for generating one or more of:
   a plurality of load analysis signals, each having a different frequency; and
   a mixed-frequency load analysis signal.

15. The system of claim 1, wherein the at least one processor is further configured for:
   determining the load impedance of the load at different frequencies of the at least one load analysis signal generated by the load analysis signal; and
   determining a load impedance spectrum associated with the load, the load impedance spectrum comprising the impedance response of the load at different applied frequencies of the at least one load analysis signal.

16. The system of claim 1, wherein load comprises an electrochemical load.

17. The system of claim 16, wherein the electrochemical load comprises one or more of: (i) a fuel cell, (ii) a battery, (iii) an electrolyser, (iv) a membrane for use in wastewater treatment, and (vi) at least one of an electrocoagulation, electroxidation and electrofloatation water treatment cell.

18. The system of claim 17 wherein the determined one or more properties of the load include one or more physical phenomena occurring within the electrochemical load determined using electrochemical impedance spectroscopy.

19. A system for measuring properties of a load, the system comprising:
   at least one inductor winding;
   a load analysis signal generator coupled to the at least one inductor winding, wherein the load analysis signal generator is configured for generating at least one time-varying load analysis signal across the at least one inductor winding;
   a DC voltage generator coupled to the at least one inductor winding, wherein the DC voltage generator is configured for generating a DC de-biasing current across the at least one inductor winding, the DC de-biasing current being used to reduce a DC flux bias generated in the at least one inductor winding;
   at least one processor coupled to the load analysis signal generator configured for:
      receiving at least one signal generated by at least one sensor in communication with the at least one processor as a result of the at least one time-varying load analysis signal being applied to the load; and
      determining one or more properties of the load based on the at least one signal.

20. The system of claim 19, wherein the at least one inductor winding is associated with a transformer.

\* \* \* \* \*